(12) United States Patent
Tang et al.

(10) Patent No.: US 10,950,257 B2
(45) Date of Patent: Mar. 16, 2021

(54) PROCESS OF FORMING A RECESSED SPIN FLIPPING ELEMENT IN THE WRITE GAP

(71) Applicant: Headway Technologies, Inc., Milpitas, CA (US)

(72) Inventors: Yuhui Tang, Milpitas, CA (US); Ying Liu, San Jose, CA (US); Min Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 189 days.

(21) Appl. No.: 16/190,790

(22) Filed: Nov. 14, 2018

(65) Prior Publication Data

US 2020/0152228 A1    May 14, 2020

(51) Int. Cl.
| | |
|---|---|
| *G11B 5/127* | (2006.01) |
| *H04R 31/00* | (2006.01) |
| *G11B 5/23* | (2006.01) |
| *G11B 5/147* | (2006.01) |
| *C23C 14/04* | (2006.01) |

(52) U.S. Cl.
CPC .............. *G11B 5/232* (2013.01); *G11B 5/147* (2013.01); *C23C 14/042* (2013.01)

(58) Field of Classification Search
CPC ........ G11B 5/147; G11B 5/232; C23C 14/042
See application file for complete search history.

(56) References Cited

U.S. PATENT DOCUMENTS

| | | | |
|---|---|---|---|
| 6,785,092 B2 | 8/2004 | Covington et al. |
| 6,809,899 B1 | 10/2004 | Chen et al. |
| 6,954,340 B2 | 10/2005 | Shukh et al. |
| 7,009,812 B2 | 3/2006 | Hsu et al. |

(Continued)

FOREIGN PATENT DOCUMENTS

| | | |
|---|---|---|
| JP | 2002-133610 | 5/2002 |
| JP | 2002-298309 | 10/2002 |

(Continued)

OTHER PUBLICATIONS

PTO Office Action, U.S. Appl. No. 12/964,202, Applicant: Sasaki et al., Notification dated Nov. 28, 2012, 11 pages.

(Continued)

*Primary Examiner* — Paul D Kim
(74) *Attorney, Agent, or Firm* — Saile Ackerman LLC; Stephen B. Ackerman (57) ABSTRACT

A method of forming a spin torque assisted magnetic recording writer is disclosed wherein a spin flipping (STO) device is recessed from an air bearing surface. The STO device has a middle flux guiding layer with a magnetization that flips to a direction anti-parallel to the write gap field when a current of sufficient magnitude is applied from the trailing shield towards the main pole (MP) thereby increasing reluctance in the write gap to enhance writability. A STO stack is deposited and patterned to define a cross-track width on the MP tapered trailing side. Thereafter, the STO stack is patterned to define a STO device with a front side recessed from the air bearing surface, and a backside. A write gap is deposited surrounding the STO device, and has a thickness greater than or ≤ to STO thickness to enable design flexibility. Then, first and second trailing shields are formed.

19 Claims, 10 Drawing Sheets

(56) References Cited

U.S. PATENT DOCUMENTS

| | | | |
|---|---|---|---|
| 7,589,600 | B2 | 9/2009 | Dimitrov et al. |
| 7,724,469 | B2 | 5/2010 | Gao et al. |
| 7,835,111 | B2 | 11/2010 | Flint et al. |
| 7,957,098 | B2 | 6/2011 | Yamada et al. |
| 7,963,024 | B2 | 6/2011 | Neuhaus |
| 7,982,996 | B2 | 7/2011 | Smith et al. |
| 8,027,110 | B1 | 9/2011 | Yamanaka et al. |
| 8,064,244 | B2 | 11/2011 | Zhang et al. |
| 8,068,312 | B2 | 11/2011 | Jiang et al. |
| 8,154,825 | B2 | 4/2012 | Takashita et al. |
| 8,264,792 | B2 | 9/2012 | Bai et al. |
| 8,295,008 | B1 | 10/2012 | Sasaki et al. |
| 8,310,787 | B1 | 11/2012 | Sasaki et al. |
| 8,320,079 | B2 | 11/2012 | Iwasaki et al. |
| 8,427,781 | B1 | 4/2013 | Sasaki et al. |
| 8,477,452 | B2 | 7/2013 | Sasaki et al. |
| 8,493,687 | B2 | 7/2013 | Sasaki et al. |
| 8,582,240 | B1 | 11/2013 | Chen et al. |
| 8,582,241 | B1 | 11/2013 | Yu et al. |
| 8,749,919 | B2 | 6/2014 | Sasaki et al. |
| 8,767,347 | B1 | 7/2014 | Sasaki et al. |
| 8,792,210 | B2 | 7/2014 | de la Fuente et al. |
| 9,202,528 | B2 | 12/2015 | Furukawa et al. |
| 9,299,367 | B1 | 3/2016 | Tang et al. |
| 9,361,912 | B1 | 6/2016 | Liu et al. |
| 9,406,317 | B1 | 8/2016 | Tang et al. |
| 9,466,319 | B1 | 10/2016 | Tang et al. |
| 9,824,701 | B2 | 11/2017 | Tang et al. |
| 9,966,091 | B2 | 5/2018 | Chen et al. |
| 10,032,469 | B2 | 7/2018 | Lim et al. |
| 10,032,470 | B1 | 7/2018 | Degawa et al. |
| 10,325,618 | B1 * | 6/2019 | Wu .......................... G10L 25/21 |
| 10,490,216 | B1 * | 11/2019 | Chen ..................... G01R 33/093 |
| 10,714,129 | B1 * | 7/2020 | Tang ..................... G11B 5/3146 |
| 2002/0034043 | A1 | 3/2002 | Okada et al. |
| 2004/0150910 | A1 | 8/2004 | Okada et al. |
| 2005/0128637 | A1 | 6/2005 | Johnston et al. |
| 2005/0141137 | A1 | 6/2005 | Okada et al. |
| 2006/0044682 | A1 | 3/2006 | Le et al. |
| 2006/0087765 | A1 | 4/2006 | Iwakura et al. |
| 2006/0103978 | A1 | 5/2006 | Takano et al. |
| 2007/0177301 | A1 | 8/2007 | Han et al. |
| 2008/0013209 | A1 | 1/2008 | Sasaki et al. |
| 2008/0088972 | A1 | 4/2008 | Sasaki et al. |
| 2009/0059426 | A1 | 3/2009 | Sasaki et al. |
| 2009/0080106 | A1 | 3/2009 | Shimizu et al. |
| 2009/0128953 | A1 | 5/2009 | Jiang et al. |
| 2009/0296275 | A1 | 12/2009 | Sasaki et al. |
| 2010/0165517 | A1 | 7/2010 | Araki et al. |
| 2011/0211271 | A1 | 9/2011 | Ng et al. |
| 2014/0071562 | A1 | 3/2014 | Chen et al. |
| 2014/0177092 | A1 | 6/2014 | Katada et al. |
| 2015/0043106 | A1 | 2/2015 | Yamada et al. |
| 2016/0218728 | A1 | 7/2016 | Zhu |
| 2017/0092304 | A1 | 3/2017 | Koizumi et al. |
| 2017/0133044 | A1 | 5/2017 | Lim et al. |
| 2018/0075868 | A1 | 3/2018 | Koui et al. |

FOREIGN PATENT DOCUMENTS

| | | |
|---|---|---|
| JP | 2008-021398 | 1/2008 |
| JP | 2010-157303 | 7/2010 |

OTHER PUBLICATIONS

"The Feasibility of Magnetic Recording at 10 Terabits Per Square Inch on Conventional Media," by Roger Wood et al., IEEE Transactions on Magnetics, vol. 45, No. 2, Feb. 2009, pp. 917-923.

Microwave Assisted Magnetic Recording, by Jian-Gang Zhu et al., IEEE Transactions on Magnetics, vol. 44, No. 1, Jan. 1, 2008, pp. 125-131.

Nov. 13, 2012, Office Action issued in Japanese Patent Application No. 2011-149242, with English language translation.

Nov. 13, 2012, Office Action issued in Japanese Patent Application No. 2011-149243, with English language translation.

Nov. 13, 2012, Office Action issued in Japanese Patent Application No. 2011-149244, with English language translation.

* cited by examiner

PROCESS OF FORMING A RECESSED SPIN FLIPPING ELEMENT IN THE WRITE GAP

RELATED PATENT APPLICATIONS

This application is related to the following: U.S. Pat. Nos. 8,582,240; 10,325,618; and 10,446,178; assigned to a common assignee and herein incorporated by reference in their entirety.

TECHNICAL FIELD

The present disclosure relates to a process for forming a recessed spin flipping device (STO) in a write gap of a spin torque assisted magnetic recording writer wherein the STO is comprised of a magnetic layer sandwiched between a spin preserving layer and a non-spin preserving layer, and having a magnetic moment that flips to an opposite direction of the write gap field when a current of sufficient magnitude is applied during a write process thereby increasing the reluctance in the write gap and forcing additional flux out of the main pole (MP) tip at the ABS to enhance the write field on the magnetic recording medium.

BACKGROUND

As the data areal density in hard disk drive (HDD) writing increases, write heads and media bits are both required to be made in smaller sizes. However, as the write head size shrinks, its writability degrades. To improve writability, new technology is being developed that assists writing to a media bit. One approach that is currently being investigated is microwave assisted magnetic recording (MAMR), which is described by J-G. Zhu et al. in "Microwave Assisted Magnetic Recording", IEEE Trans. Magn., vol. 44, pp. 125-131 (2008).

In a MAMR writer, the main pole generates a large local magnetic field to change the magnetization direction of the medium in proximity to the writer. By switching the direction of the field using a switching current that drives the writer, one can write a plurality of media bits on a magnetic recording medium. In MAMR, a spin torque oscillator (STO) is inserted in the WG, and when a critical current is applied, a STO oscillation layer is driven into a precessional state to apply a RF field on a magnetic medium bit to lower the coercivity therein and thereby lower the switching current necessary to provide a MP field for a write process. Magnetic flux in the main pole proceeds through the ABS and into a medium bit layer and soft underlayer (SUL). In some common designs, the flux returns to the write head through a trailing side loop comprised of a trailing shield structure, and through a leading side loop that includes a leading shield and back gap connection. There is also a gap field that exits the main pole through the write gap, side gaps, and leading gap, and is not directly responsible for writing.

Although MAMR has been in development for a number of years, it is not shown enough promise to be introduced into any products yet because of several technical problems. One problem is a fringing growth when the spin torque oscillator (STO) bias is turned on. Thus, when a current of sufficient magnitude is applied across the STO device, the oscillation (flux generation) layer may flip to be anti-parallel to the write gap. As a result, the reluctance in the write gap is increased thereby boosting the MP write field and the return field to the trailing shield.

Spin transfer (spin torque) devices are based on a spin-transfer effect that arises from the spin dependent electron transport properties of ferromagnetic-non-magnetic spacer-ferromagnetic multilayers. When a spin-polarized current passes through a magnetic multilayer in a CPP (current perpendicular to plane) configuration, the magnetic moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer such as the STO flux generation layer (FGL) if the current density is sufficiently high.

The insertion of a thin STO device in the write gap adds extra steps and dimensional control requirements for the fabrication process. Therefore, a straightforward process that readily integrates the STO device with existing features in the MAMR writer is desired for lower cost and higher device yield. Preferably, an improved process will enable greater flexibility in STO design.

SUMMARY

One objective of the present disclosure is to provide a process for forming a recessed STO device in a write gap of a spin torque assisted magnetic recording writer that is readily implemented in existing writer fabrication process flows.

A second objective of the present disclosure is to provide a process of forming a recessed STO device according to the first objective that relaxes certain dimensional control requirements to enable more degrees of freedom in writer design.

According to one embodiment of the present disclosure, these objectives are achieved with a process sequence of forming a spin torque assisted magnetic recording writer structure where a spin flipping element also called a STO device or STO is formed on a MP tapered trailing side, and has a front side that is recessed from the ABS and separated therefrom by a write gap layer. The process has flexibility in that the write gap thickness may range from less than to greater than the STO thickness. The STO has a lower non-spin preserving layer that is an electrical conductor contacting the MP tapered trailing side, a middle flux guiding layer (FGL), and an upper spin preserving layer that is also electrically conductive. The middle FGL has a magnetization, aligned in the direction of the write gap field, that oscillates when a critical current ($I_C$) is applied, but the FGL magnetization flips to an opposite direction when a current ($I_B$) of sufficient magnitude is reached where $I_B > I_C$. Accordingly, there is more reluctance in the WG, which drives more magnetic flux from the MP tip to the ABS and into a magnetic medium for improved writability. Since the STO is recessed at least 10 nm and up to 400 nm from the ABS, fringing growth is considerably reduced compared with a scheme where the STO is at the ABS. As a result, MP fringing is controlled and TPI increases substantially compared with conventional MAMR designs.

According to a preferred embodiment, the STO has a cross-track width that is at least 10 nm, but not more than a maximum width of the MP tapered trailing side. However, in other embodiments, the STO width may exceed the maximum width of the MP tapered trailing side providing there is sufficient width in the mask that determines the WG and first trailing shield width. The STO has a height of 10 nm to 500 nm that represents a distance (orthogonal to the ABS) between the front side and backside. STO down-track thickness is at least 1 nm. The FGL has a magnetization saturation (Ms) value from 4 kiloGauss (kG) to 24 kG. The non-spin preserving layer may be Ta, Ru, W, Pt, or Ti while the FGL is preferably a magnetic multilayer comprised of $Ni_xFe_{100-x}$, $Co_yFe_{100-y}$, $Co_zNi_{100-z}$, or alloys thereof, and where x, y, and z are between 0 and 100 atomic %. The spin preserving layer is one of Cu, Ag, Au, Cr, and Al, or alloys thereof.

According to one embodiment, a first step in the process flow of the present disclosure is formation of a tapered trailing side on the main pole that extends from the eventual ABS plane to a corner where the tapered trailing side connects with a MP top surface that is aligned orthogonal to the ABS plane. In some designs, the MP tapered trailing side has a trailing edge at the ABS plane that is coplanar with a top surface of the adjacent side shields and adjoining side gaps. Next, the STO stack of layers with a first thickness is deposited on the MP tapered trailing side, above the MP top surface, and on the side shields and side gaps. Thereafter, a first photoresist layer is coated on the STO stack of layers, and is patterned to provide a line shape with a first width on the MP tapered trailing side and extending over the MP top surface when a rectangular shaped STO element is desired. Alternatively, the photoresist layer has an elongated shape that is subsequently patterned into a trapezoidal shape or a shape substantially similar to the underlying MP tapered trailing side. A write gap layer with a second thickness (d) is deposited on the side shields and on uncovered regions of the MP tapered trailing side. Once the first photoresist layer is removed, a second photoresist layer is coated and patterned to form a rectangular shaped line (or alternative trapezoidal or MP tapered trailing side shape) having a first width on a portion of the STO line shape. The front side of the patterned photoresist layer (mask) is at the desired recess position of the front side of the subsequently formed STO device while the backside of the photoresist mask determines the STO device backside. An ion beam etch (IBE) or reactive ion etch (RIE) process is employed to transfer the rectangular (or alternative) shaped pattern through the STO stack of layers to yield the STO device.

In the following step, the write gap is deposited between the STO front side and the ABS plane with flexibility in realizing a write gap thickness (d1) where d1≤t or d1>t. Next, the first TS layer is preferably conformally deposited on the STO device and on the write gap surrounding the STO. Finally, a second TS layer is deposited on the first TS layer and on the side shields, and is patterned to form a backside at the same height as that of the first TS layer. Thereafter, the remainder of the writer fabrication process follows conventional methods used in the art.

DETAILED DESCRIPTION

The present disclosure is a process for forming a spin torque assisted magnetic writer structure wherein a STO device is recessed from the ABS and formed in the write gap to increase reluctance between the MP and trailing shield when a current of sufficient magnitude is applied thereby forcing more magnetic flux from the MP tip at the ABS to enhance writability. In the drawings, the y-axis is in a cross-track direction, the z-axis is in a down-track direction, and the x-axis is in a direction orthogonal to the ABS and towards a back end of the writer structure. Thickness refers to a down-track distance, width is a cross-track distance, and height is a distance from the ABS in the x-axis direction. The terms spin flipping element and STO device may be used interchangeably. The term "behind" refers to an x-axis position of one structural feature with respect to another. For example, component B formed behind component or plane A means that B is at a greater height from the ABS than A. A "front side" of a layer is a side facing the ABS plane, and a backside or backend faces away from the ABS plane.

Figure 1:
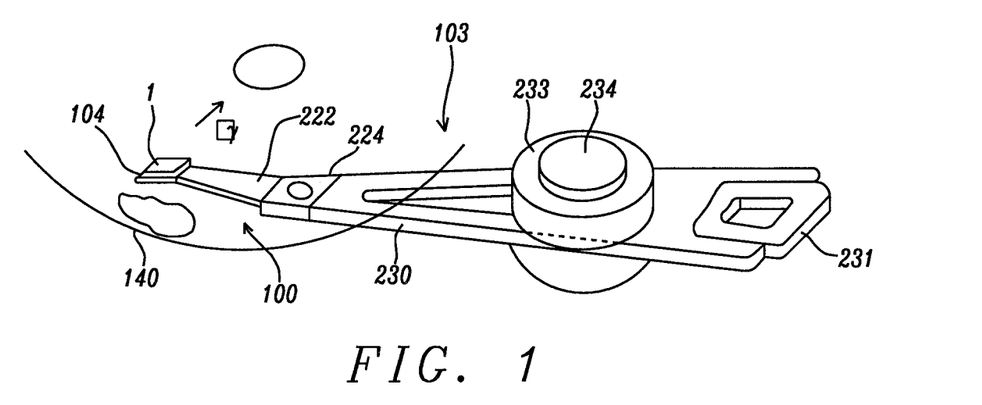
FIG. 1 is a perspective view of a head arm assembly of the present disclosure.

Referring to FIG. 1, a head gimbal assembly (HGA) 100 includes a magnetic recording head 1 comprised of a slider and a PMR writer structure formed thereon, and a suspension 103 that elastically supports the magnetic recording head. The suspension has a plate spring-like load beam 222 formed with stainless steel, a flexure 104 provided at one end portion of the load beam, and a base plate 224 provided at the other end portion of the load beam. The slider portion of the magnetic recording head is joined to the flexure, which gives an appropriate degree of freedom to the magnetic recording head. A gimbal part (not shown) for maintaining a posture of the magnetic recording head at a steady level is provided in a portion of the flexure to which the slider is mounted.

HGA 100 is mounted on an arm 230 formed in the head arm assembly 103. The arm moves the magnetic recording head 1 in the cross-track direction y of the magnetic recording medium 140. One end of the arm is mounted on base plate 224. A coil 231 that is a portion of a voice coil motor is mounted on the other end of the arm. A bearing part 233 is provided in the intermediate portion of arm 230. The arm is rotatably supported using a shaft 234 mounted to the bearing part 233. The arm 230 and the voice coil motor that drives the arm configure an actuator.

Figure 2:
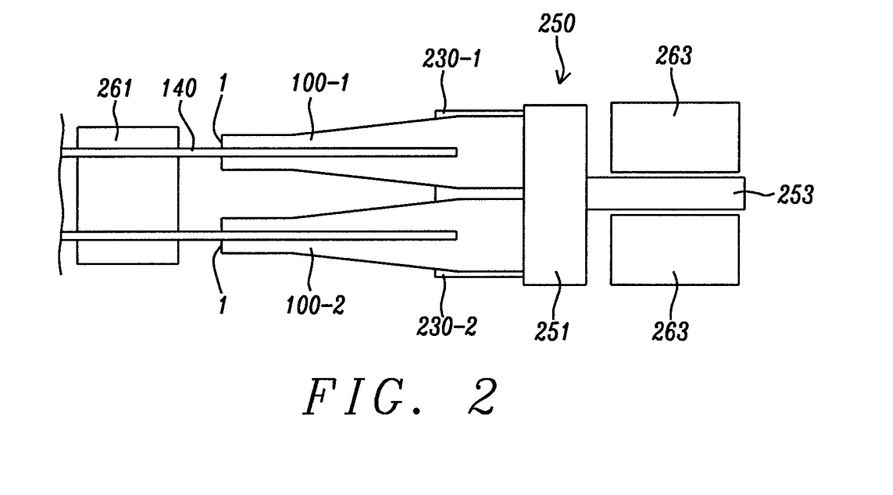
FIG. 2 is side view of a head stack assembly of the present disclosure.

Next, a side view of a head stack assembly (FIG. 2) and a plan view of a magnetic recording apparatus (FIG. 3) wherein the magnetic recording head 1 is incorporated are depicted. The head stack assembly 250 is a member to which a first HGA 100-1 and second HGA 100-2 are mounted to arms 230-1, 230-2, respectively, on carriage 251. A HGA is mounted on each arm at intervals so as to be aligned in the perpendicular direction (orthogonal to magnetic medium 140). The coil portion (231 in FIG. 1) of the voice coil motor is mounted at the opposite side of each arm in carriage 251. The voice coil motor has a permanent magnet 263 arranged at an opposite position across the coil 231.

Figure 3:
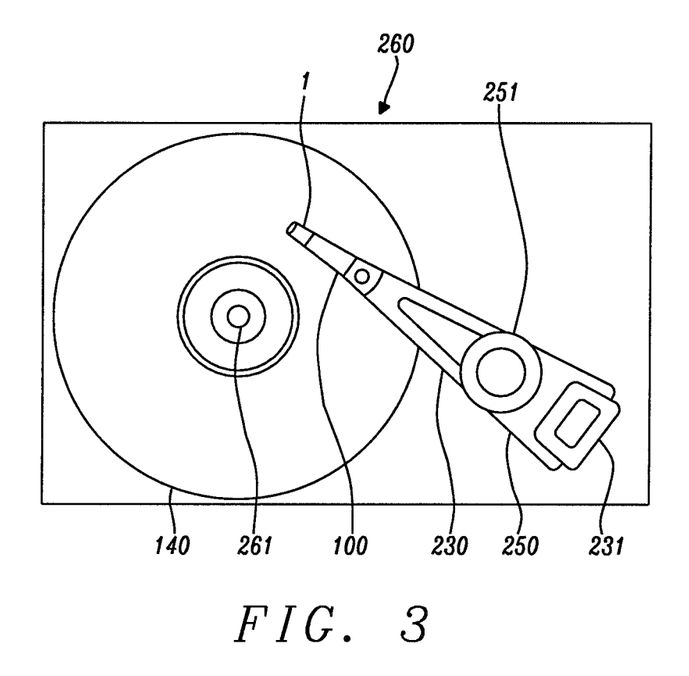
FIG. 3 is a plan view of a magnetic recording apparatus of the present disclosure.

With reference to FIG. 3, the head stack assembly 250 is incorporated in a magnetic recording apparatus 260. The magnetic recording apparatus has a plurality of magnetic media 140 mounted to spindle motor 261. For every magnetic recording medium, there are two magnetic recording heads arranged opposite one another across the magnetic recording medium. The head stack assembly and actuator except for the magnetic recording heads 1 correspond to a positioning device, and support the magnetic recording heads, and position the magnetic recording heads relative to the magnetic recording medium. The magnetic recording heads are moved in a cross-track of the magnetic recording medium by the actuator. The magnetic recording head records information into the magnetic recording media with a PMR writer element (not shown) and reproduces the information recorded in the magnetic recording media by a magnetoresistive (MR) sensor element (not shown).

Figure 4:
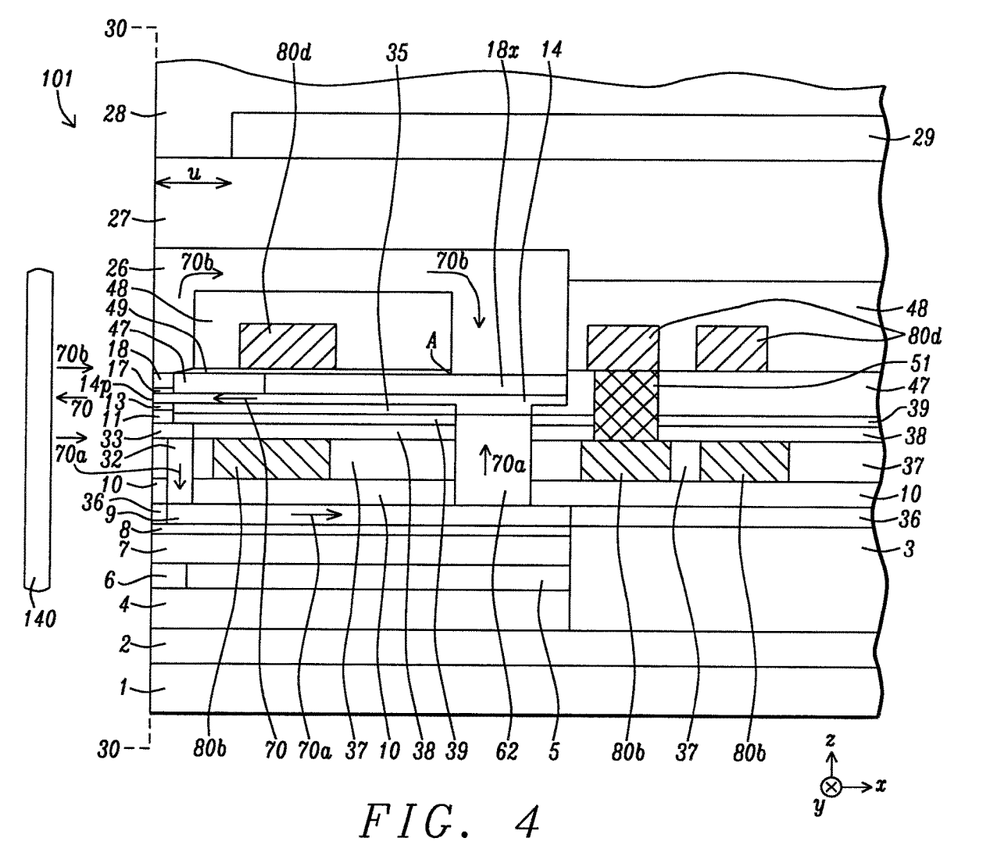
FIG. 4 is a down-track cross-sectional view of a combined read-write head with leading and trailing loop pathways for magnetic flux return to the main pole according to an embodiment of the present disclosure.

Referring to FIG. 4, writer structure 101 comprises a combined read-write head. The down-track cross-sectional view is taken along a plane (44-44 in FIG. 5) formed orthogonal to the ABS 30-30, and that bisects the main pole layer 14. The read head is formed on a substrate 1 that may be comprised of AlTiC (alumina+TiC) with an overlying insulation layer 2 that is made of a dielectric material such as alumina. The substrate is typically part of a slider formed in an array of sliders on a wafer. After the combined read head/write head is fabricated, the wafer is sliced to form rows of sliders. Each row is typically lapped to afford an ABS before dicing to fabricate individual sliders that are used in a magnetic recording device. A bottom shield 4 is formed on insulation layer 2.

A magnetoresistive (MR) element also known as MR sensor 6 is formed on bottom shield 4 at the ABS 30-30 and typically includes a plurality of layers (not shown) including a tunnel barrier formed between a pinned layer and a free layer where the free layer has a magnetization (not shown) that rotates in the presence of an applied magnetic field to a position that is parallel or antiparallel to the pinned layer magnetization. Insulation layer 5 adjoins the backside of the MR sensor, and insulation layer 3 contacts the backsides of the bottom shield and top shield 7. The top shield is formed on the MR sensor. An insulation layer 8 and a top shield (S2B) layer 9 are sequentially formed on the top magnetic shield. Note that the S2B layer 9 may serve as a flux return path (RTP) in the write head portion of the combined read/write head. Thus, the portion of the combined read/write head structure formed below layer 9 in FIG. 4 is typically considered as the read head. In other embodiments (not shown), the read head may have a dual reader design with two MR sensors, or a multiple reader design with multiple MR sensors.

The present disclosure anticipates that various configurations of a write head may be employed with the read head portion. In the exemplary embodiment, magnetic flux 70 in main pole (MP) layer 14 is generated with flowing a current through bucking coil 80$b$ and driving coil 80$d$ that are below and above the main pole layer, respectively, and are connected by interconnect 51. Magnetic flux 70 exits the main pole layer at pole tip 14$p$ at the ABS 30-30 and is used to write a plurality of bits on magnetic media 140. Magnetic flux 70$b$ returns to the main pole through a trailing loop comprised of trailing shields 17, 18, PP3 shield 26, and top yoke 18$x$. There is also a leading return loop for magnetic flux 70$a$ that includes leading shield 11, leading shield connector (LSC) 33, S2C 32, return path 9, and back gap connection (BGC) 62. The magnetic core may also comprise a bottom yoke 35 below the main pole layer. Dielectric layers 10, 11, 13, 36-39, and 47-49 are employed as insulation layers around magnetic and electrical components. A protection layer 27 covers the PP3 trailing shield and is made of an insulating material such as alumina. Above the protection layer and recessed a certain distance u from the ABS 30-30 is an optional cover layer 29 that is preferably comprised of a low coefficient of thermal expansion (CTE) material such as SiC. Overcoat layer 28 is formed as the uppermost layer in the write head.

Figure 5:
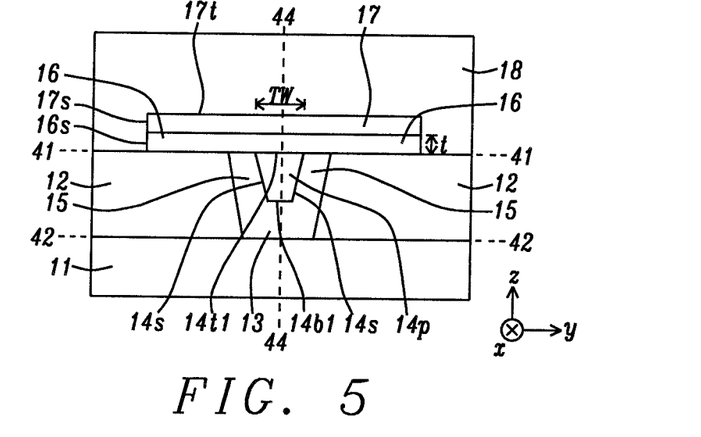
FIG. 5 is an ABS view of an all wrap around (AWA) shield structure surrounding a main pole (MP) according to an embodiment of the present disclosure.

Referring to FIG. 5, a main pole (MP) with MP tip 14$p$ having track width TW, trailing side 14$t$1, leading side 14$b$1, and two sides 14$s$ formed equidistant from a center plane 44-44 is shown with an AWA shield structure that was described in related U.S. Pat. No. 10,325,618 and formed according to an embodiment of the present disclosure. There is a write gap 16 with thickness t on the MP trailing side, side gaps 15 adjoining each MP side 14s, and a leading gap 13 below the MP leading side. The trailing shield structure comprises a first trailing shield (TS) with a high magnetic saturation value from 19 kiloGauss (kG) to 24 kG that is formed on the write gap. The trailing shield structure also includes a second TS layer 18 formed on the first TS top surface 17t and sides 17s, on write gap sides 16s, and on a top surface of the side shields 12 at plane 41-41. Plane 41-41 includes the MP trailing side at the ABS. Side shields contact a top surface of the leading shield 11 at plane 42-42 that is parallel to plane 41-41 and includes the MP leading side at the ABS.

Figure 6:
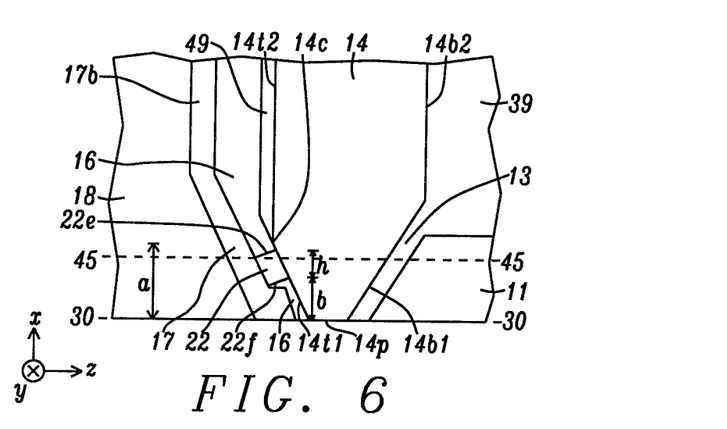
FIG. 6 is a down-track cross-sectional view showing a leading shield and a trailing shield structure on opposite sides of the MP in FIG. 5, and a recessed STO formed within the write gap according to an embodiment of the present disclosure.

In FIG. 6, the down track cross-sectional view at center plane 44-44 in FIG. 5 is illustrated and shows an enlarged portion of the spin torque assisted writer (write head 101 in FIG. 4) proximate to the MP tip 14p at the ABS 30-30 according to an embodiment of the present disclosure. MP leading side 14b1 is tapered and extends from the ABS 30-30 to MP bottom surface 14b2 that is aligned orthogonal to the ABS. Moreover, a top surface 11t of the leading shield 11 is substantially parallel to the tapered MP leading side and separated therefrom by leading gap 13. The MP trailing side 14t1 is also tapered with taper angle α with respect to plane 46-46 formed orthogonal to the ABS, and connects with MP top surface 14t2 that is parallel to the MP bottom surface. Write gap 16 is formed between MP tapered trailing side 14t1 and the first TS front portion 17 that is substantially parallel to the MP tapered trailing side. The first TS also has a back portion 17b that is parallel to MP top surface 14t2, and separated therefrom by the write gap 16 and dielectric layer 49 formed on the MP top surface.

Figure 7:
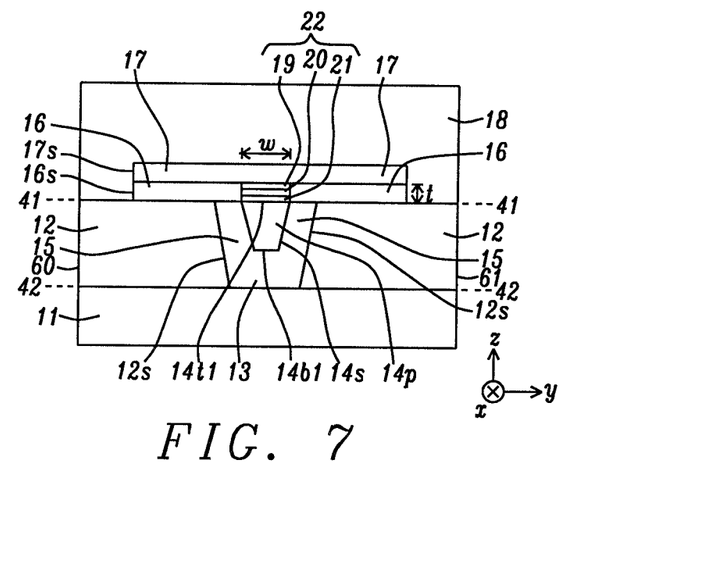
FIG. 7 is cross-sectional view from a plane formed parallel to the ABS in FIG. 6 that depicts the recessed STO in the write gap between the trailing shield and main pole trailing side according to an embodiment of the present disclosure.

A cross-sectional view in FIG. 7 is taken at plane 45-45 that is parallel to the ABS and intersects a portion of the STO device 22 in FIG. 6. It should be understood that other leading shield and trailing shield designs are compatible with the recessed STO device of the present disclosure. Thus, the embodiments of the present disclosure are not limited to the surrounding shield designs including the leading shield, trailing shield, and side shields described herein.

STO device 22 features a lower non-spin preserving layer 21 on the MP tapered trailing side, a middle flux guiding layer (FGL) 20, and an upper spin preserving layer 19. Non-spin preserving layer 21 is typically a metal such as Ta, W, Pt, Ru, Ti, or Pd. FGL 20 is a magnetic layer that is preferably a multilayer structure comprised of one or more of NiFe, FeCo, CoNi, or an alloy thereof with one or more additional elements. The FGL has a Ms value from 4 kG to 24 kG. The one or more additional elements are selected from B, and metals that are Mo, W, Pt, Pd, or Cr, for example. Spin preserving layer 19 is a conductive layer and is preferably comprised of Cu, Ag, Au, Al, or Cr, or an alloy thereof.

In the exemplary embodiment, STO width w is essentially equivalent to the width of the MP tapered trailing side 14t1 at plane 45-45. However, in other embodiments, as depicted in FIG. 9, width w may be less than the MP tapered trailing side width between sides 14s at the recessed height b. Preferably, STO width is at least 10 nm. In other embodiments, STO thickness t may be less than the write gap thickness. Although w is preferably less than the maximum width w1 of the MP tapered trailing side, in some embodiments, w may be greater than w1. To counteract the tendency of a growth in fringing as the MP write field increases, a recessed STO has been proposed as described in related U.S. Pat. No. 10,446,178. Furthermore, we described additional STO embodiments, where a portion of the STO device 22 may overlay on MP sides 14s but w is less than w1 (width of the interface 14x where the MP tip 14p backside adjoins the MP back portion 14 at height a).

Figure 8A:
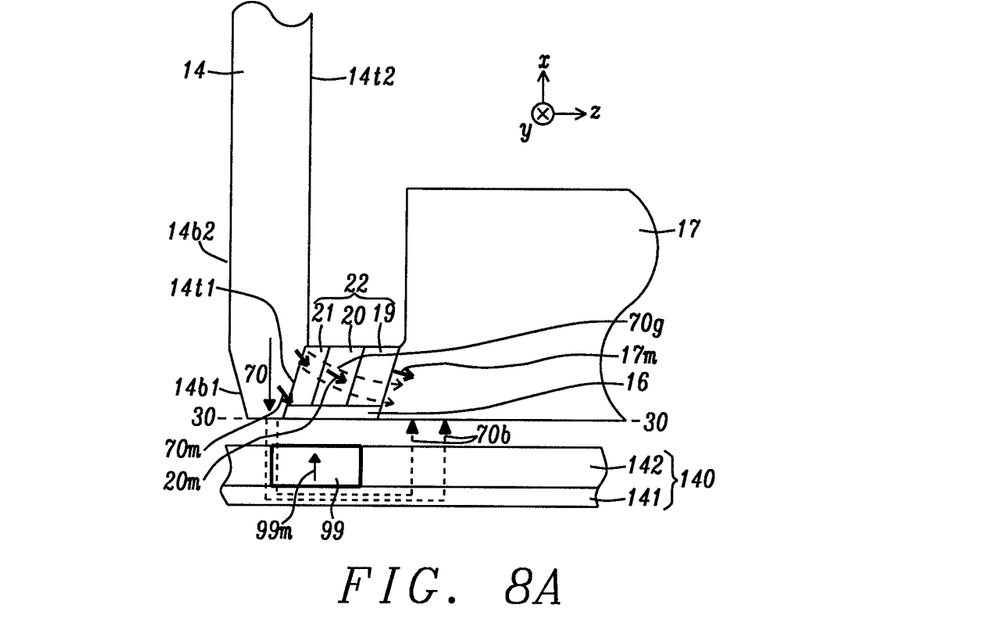
FIGS. 8A-8B show a cross-sectional view of a STO device between a MP and trailing shield and FGL flipping after a current is applied across the STO device.

A conventional MAMR writer structure and a description of a STO device having a microwave assist effect during a write process by way of generating a RF field on a magnetic bit was previously described in related U.S. Pat. No. 8,582,240. In the present disclosure depicted in FIGS. 8A-8B, a key feature is a recessed STO device 22 wherein FGL 20 has magnetization 20m (FIG. 8A) that flips to an opposite direction (FIG. 8B) when a current ($I_B$) of sufficient magnitude is applied across the STO from first TS layer 17 to MP tapered trailing side 14t1. Although the exemplary embodiment shows a STO design with a FGL between a spin preserving layer 19 and a non-spin preserving layer 21, the STO device is not limited to a three layer stack and may comprise other STO schemes known in the art. In the absence of an applied current (FIG. 8A), FGL magnetization 20m is substantially parallel to the write gap field 70g, to MP magnetization 70m at MP trailing side 14t1, and to TS magnetization 17m at a STO top surface where spin preserving layer 19 interfaces with the first TS layer 17.

Figure 8B:
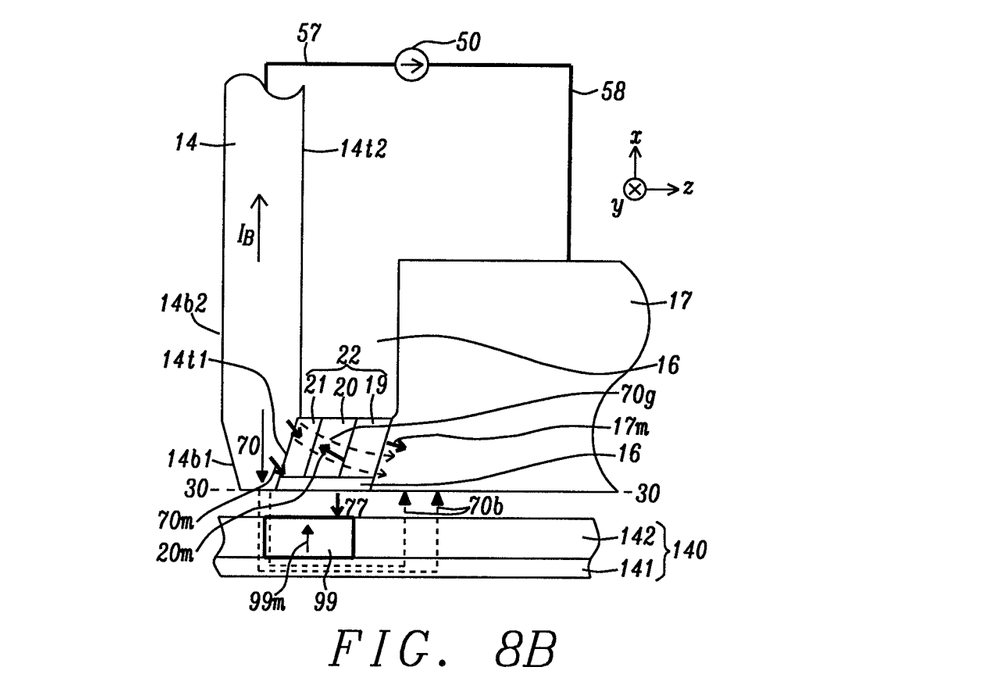

As shown in FIG. 8B, when current $I_B$ is applied from first TS layer 17 to MP 14, FGL magnetization 20m flips to a direction that is substantially anti-parallel to write gap field 70g that enhances MP write field 70 on magnetization 99 in a magnetic bit 99. The magnetic bit is in bit layer 142 on a soft underlayer 141 in magnetic medium 140. Current $I_B$ is applied from a direct current (DC) source 50 through lead 58 to first TS layer 17 and exits the MP through a second lead 57. The STO device 22 is configured so that sufficient spin torque (not shown) is exerted on FGL 20 to flip the FGL magnetization.

Figure 8C:
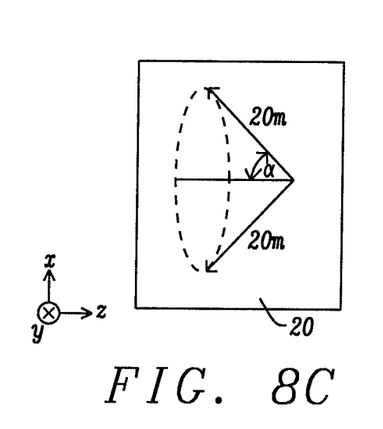
FIG. 8C shows the precessional state of FGL magnetization in FIG. 8B.

Note that the degree of FGL magnetization flipping is determined by the magnitude of $I_B$. FGL magnetization 20m is driven into a precessional state having cone angle α (FIG. 8C). As $I_B$ increases, the cone angle decreases until it is proximate to 0 degrees at which time FGL magnetization 20m is aligned essentially anti-parallel to the write gap field and orthogonal to MP tapered trailing side 14t1 to provide a maximum enhancement of write field 70. Furthermore, a MAMR effect (RF field 77) is generated on magnetic bit 99 but decreases with increasing $I_B$ until becoming negligible when the cone angle is proximate to 0 degrees. Therefore, in some embodiments where the precessional cone angle is sufficiently large, not only does FGL flipping enhance the write field 70 by increasing reluctance in write gap 16, but also generates a RF field 77, which decreases coercivity in magnetic bit 99 thereby enabling a lower write field to switch bit magnetization 99m. However, as the recessed height of STO device 22 becomes larger, the MAMR effect (RF field) will decrease significantly even with precessional cone angles approaching 90 degrees.

Figure 9A:
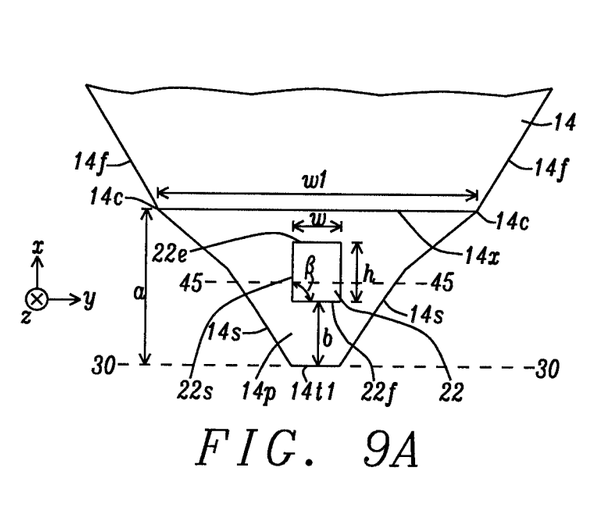
FIGS. 9A-9C are top-down views of the recessed STO device in FIG. 7 that features a rectangular shape having a width<MP width, a rectangular shape having a width>MP width, and a shape with curved sides, respectively.

Referring to FIG. 9A, STO device 22 has a front side 22f that is recessed a distance b of 10 nm to 400 nm from the ABS 30-30, and having a backside 22e. In the exemplary embodiment, the STO backside is less than the throat height a, which is essentially at MP corner 14c where the MP tapered trailing side 14t1 connects with MP top surface 14t2. However, in other embodiments, the backside may be at a height greater than a. Since fringing is mainly determined by the magnetic field at the ABS, the recessed STO described herein results in significantly less fringing growth compared with a MAMR scheme where the STO front side is at the ABS.

The recessed STO has a height h of 10 nm to 500 nm, and a down-track thickness t in the z-axis direction that in some embodiments is equal to a thickness t of the write gap 16 as shown in FIG. 7. In alternative embodiments, t may be greater than or less than the write gap thickness as explained later.

The top-down view in FIG. 9A shows two sides 14s on the MP tip 14p, and two flared sides 14f on a back MP portion 14 where each side 14s connects with a side 14f at a corner 14c. The MP tip and MP back portion adjoin each other at interface 14x. In all embodiments, interface 14x between corners 14c has a cross-track width w1 that is greater than or equal to STO width w. STO sides 22s each have a height h and connect one end of front side 22f with an end of backside 22e. In the exemplary embodiment, angle β=90 degrees and the STO has a rectangular shape. However, the present disclosure encompasses other top-down shapes including trapezoids wherein the backside 22e has a larger width than the front side 22f (β>90 degrees), and trapezoids where the backside has a smaller width than the front side (β<90 degrees) that are described in related U.S. Pat. No. 10,446,178. Thus, cross-track width w between the STO sides may become increasingly smaller or larger with increasing distance of plane 45-45 from the ABS 30-30 depending on whether the trapezoid front side has a larger or smaller width, respectively, than the trapezoid backside.

Figure 9B:
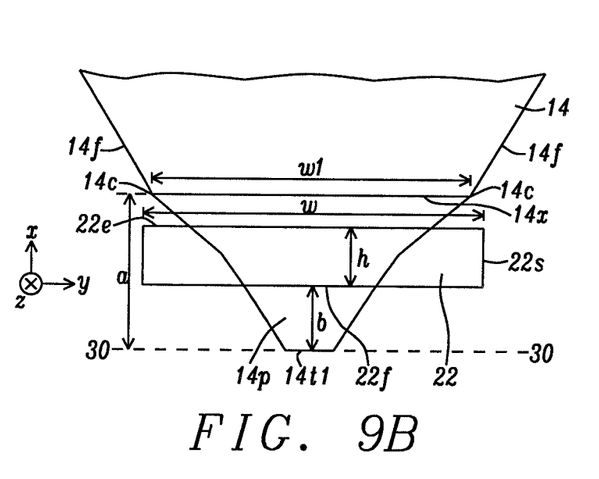

FIG. 9B is an alternative embodiment showing a top-down view of a STO device 22 that has a rectangular shape and a width w greater than the maximum width w1 of the MP tapered trailing side. Here, the mask that determines the write gap width w2 in FIG. 17 must have sufficient width so that w2 is greater than the STO width.

Figure 9C:
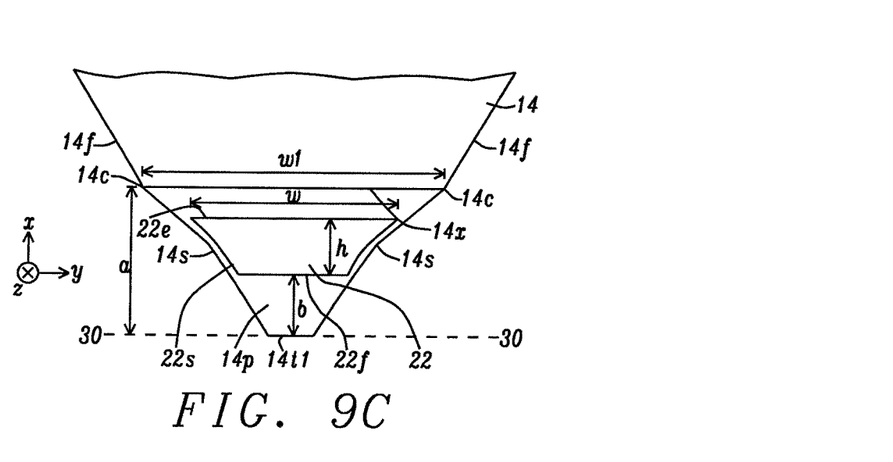

In FIG. 9C, another embodiment is depicted where STO device 22 has curved sides 22s that are aligned substantially parallel to curved MP sides 14s. Backside 22e has width w that is greater than the width of front side 22f.

Figure 10A:
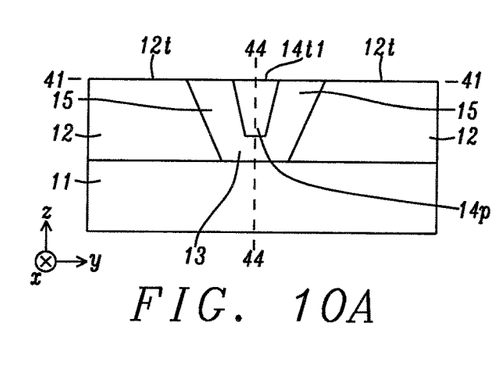
FIG. 10A and FIG. 10B show an ABS view and down-track cross-sectional view, respectively, of a first step in the process of the present disclosure where a tapered trailing side is formed on the main pole.
Figure 10B:
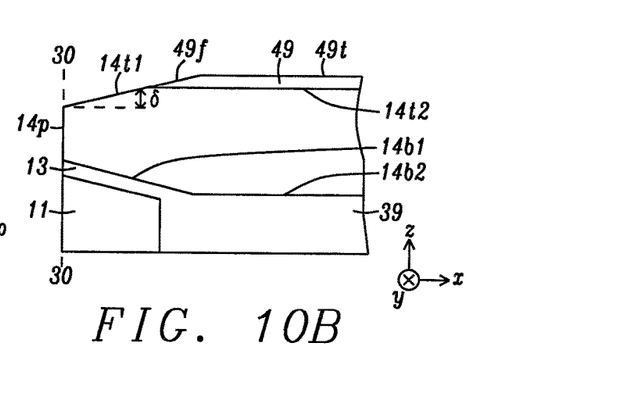

A process sequence for fabricating the recessed STO according to an embodiment of the present disclosure is provided in FIG. 10A through FIG. 18. The partially formed MAMR writer structure including MP tip 14p that adjoins side gaps 15 and leading gap 13 in FIG. 10A is provided according to a conventional process sequence. Side shield top surfaces 12t are coplanar with a trailing edge of the MP tapered trailing side 14t1 at plane 41-41, which is orthogonal to the subsequently formed ABS plane. FIG. 10B shows the down-track cross-sectional view at plane 44-44 in FIG. 10A. MP tapered trailing side 14t1 has a taper angle δ and is coplanar with a tapered front side 49f of dielectric layer 49 made of $Al_2O_3$ or $SiO_2$ that is formed on MP top surface 14t2. Note that the eventual ABS, hereafter referred to as ABS plane 30-30, is not determined until a lapping process is performed after all layers in the MAMR writer structure are formed.

Figure 11A:
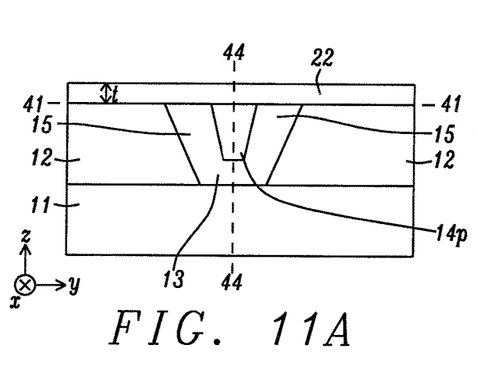
FIG. 11A and FIG. 11B depict an ABS view, and down-track cross-sectional view, respectively, of a second step of the present disclosure where a STO layer is formed on the MP tapered trailing side and side shields.
Figure 11B:
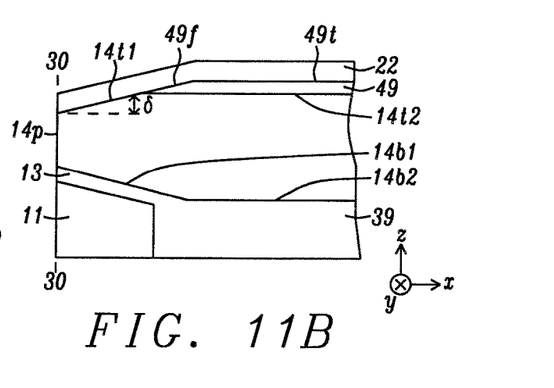

In FIG. 11A, STO 22 with thickness t, and comprised of a stack of layers 21/20/19 described previously is deposited on the MP tapered trailing side 14t1 and on dielectric layer 49. As indicated in FIG. 11B, the STO stack of layers is preferably conformal to the underlying topography and has a uniform thickness on the MP tapered trailing side and above MP top surface 14t2.

Figure 12A:
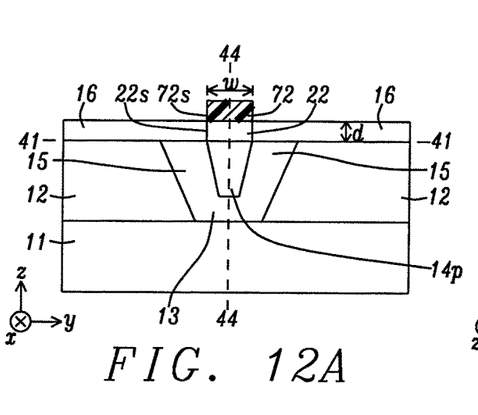
FIG. 12A and FIG. 12B show an ABS view and top-down view, respectively, of a third step of the present disclosure where the STO stack of layers is patterned to establish a cross-track width.

Referring to FIG. 12A, a first photoresist layer is coated on the STO stack 22, and is patternwise exposed and developed to provide a photoresist mask 72 having sides 72s and a cross-track width w that is bisected by plane 44-44. The photoresist mask pattern is etch transferred through the STO stack using a RIE process, for example, thereby forming sides 22s on the STO stack that also has a width w.

Thereafter, write gap layer 16 with thickness d is deposited on the side shields 12 and side gaps 15.

Figure 12B:
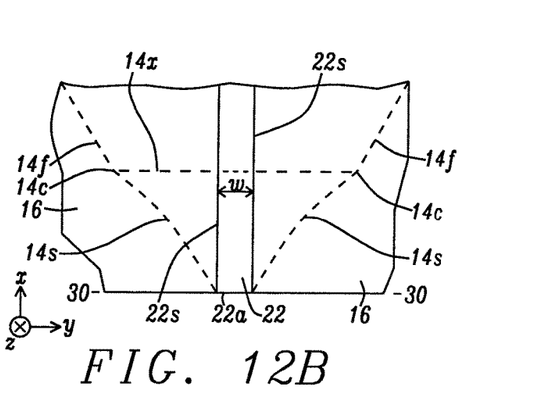

FIG. 12B is a top-down view depicting the partially formed spin torque assisted magnetic recording writer structure in FIG. 12A after the photoresist mask 72 is removed by a conventional method. According to one embodiment, STO stack 22 has a rectangular shape and a constant width w that extends in the x-axis direction from the ABS plane 30-30 and between MP tip curved sides 14s and extends over the MP back portion 14 between flared sides 14f. In other embodiments (not shown), the STO shape may be a trapezoid (or a shape with curved sides as shown in FIG. 9C) where sides 22s are not orthogonal to the ABS. In yet another embodiment, the STO shape, whether a rectangle or a trapezoid, has a width w sufficiently large such that each STO side 22s overlays on a portion of the nearer MP side 14s between the ABS plane and interface 14x.

Figure 13:
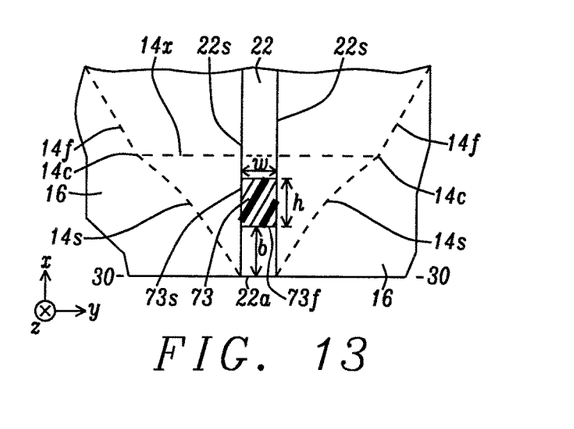
FIG. 13 is a top-down view showing a first photoresist layer patterned on a top surface of the STO stack of layers in FIG. 12B where a recessed front side and height of the first photoresist layer will determine the recess and height in the subsequently formed STO device.

Referring to FIG. 13, a second photoresist is coated on STO stack 22 and write gap 16, and is then patternwise exposed and developed with a conventional photolithography process to form photoresist mask 73 having width w and height h corresponding to the desired dimensions of the eventual STO device. The front side 73f of the photoresist mask is recessed at height b from ABS plane 30-30. Although the exemplary embodiment shows h>w, w may be greater than or equal to h in other embodiments. Preferably, a side 73s of the photoresist mask overlays on a STO side 22s. Thus, in embodiments where a trapezoidal shape (not shown) or shape with curved sides (FIG. 9C) is desired for the STO device, sides 73s are separated with increasing width between front side 73f and a backside of photoresist mask 73.

Figure 14A:
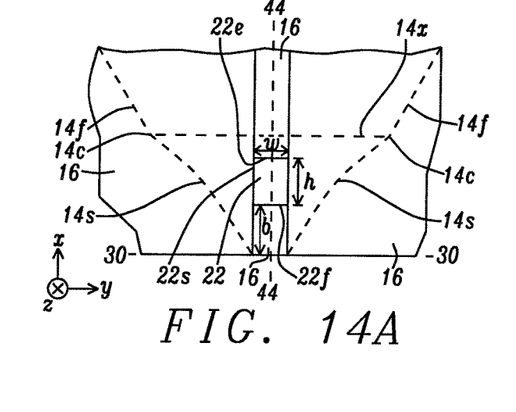
FIG. 14A is a top-down view and FIG. 14B is a down-track cross-sectional view after the pattern in the first photoresist layer in FIG. 13 is etch transferred through the underlying STO to form a STO device with a front side and backside, and a write gap layer is deposited in regions not covered by the STO device.

FIG. 14A illustrates a top-down view of the partially formed spin torque assisted magnetic recording writer structure in FIG. 13 after a RIE or IBE is performed to remove front and back portions of STO stack 22 that are not protected by photoresist mask 73 thereby forming STO front side 22f at height b, and STO backside 22e at height (b+h) from the ABS plane 30-30. The etch process stops on MP tapered trailing side 14t1 and on dielectric layer 49 previously covered by STO stack 22. Note that the initially deposited write gap in FIG. 13 is not covered by the photoresist mask, and is typically removed during the etch. Thereafter, the photoresist mask is removed and a write gap 16 is deposited to thickness d1 between the ABS plane 30-30 and STO front side, and behind the STO backside. The write gap also has thickness d1 adjacent to the STO sides 22s.

Figure 14B:
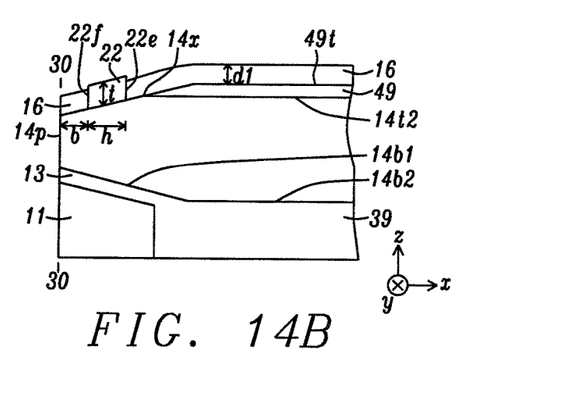

FIG. 14B shows a down-track cross-sectional view at plane 44-44 in FIG. 14A. The process of the present disclosure is flexible in enabling STO thickness t to be greater than, equal to, or less than write gap thickness d1. In other words, the duration of write gap deposition may be shortened so that d1<t, or may be lengthened such that d1>t (not shown) using a physical vapor deposition (PVD) method, for example.

Figure 15:
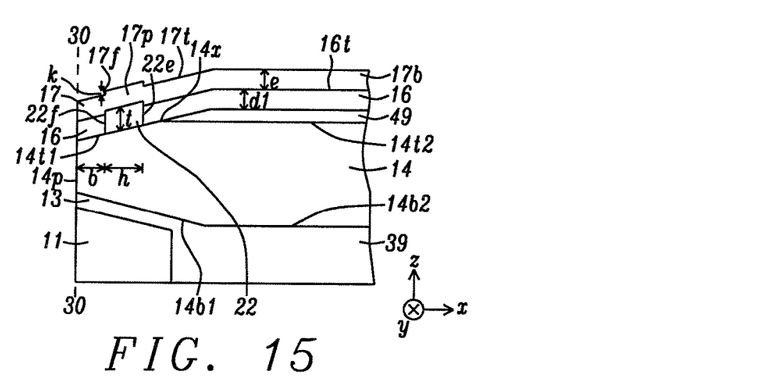
FIG. 15 is a down-track cross-sectional view of the writer structure in FIG. 14B after a first trailing shield (TS) layer is deposited on the STO device and on the write gap.

In the following step depicted in FIG. 15, the first TS layer 17 is deposited on a top surface 16t of the write gap 16 and on STO device 22. The first TS layer has a front side at the ABS plane 30-30 and a thickness e that is preferably uniform. In other words, if there is topography where t>d1 in the exemplary embodiment, or d1>t in an alternative embodiment, the first TS layer typically has a non-planar tapered top surface 17t.

Figure 16:
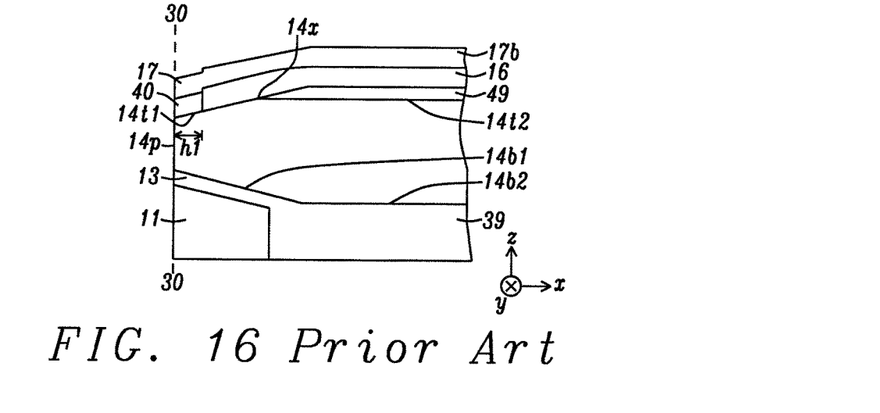
FIG. 16 is a down-track cross-sectional view of a conventional writer showing a STO at the ABS and a first TS layer formed thereon.

The process of the present disclosure provides an advantage over the prior art shown in FIG. 16 in that the height h1 of the first TS tip 17 is determined by height h1 of STO 40 in a conventional scheme. Thus, the STO and first TS tip dimensions are limited in that they are matched to each other in the x-axis direction. Moreover, the conventional scheme requires dimension control of both features (STO and first TS tip). A conventional MAMR writer with STO 40 having a front side at the ABS 30-30 was described in related U.S. Pat. No. 10,446,178.

Returning to FIG. 15, the recess height b automatically defines the height of a front side 17f of the first TS tip 17p, and the difference in thickness (t–d1) between STO device 22 and write gap 16 determines the first TS tip thickness k. In other words, when the STO thickness t is equal to write gap thickness d1 according to some designs, the first TS tip 17p will disappear, and is replaced with a planar tapered first TS top surface 17t. Furthermore, the dielectric gap (d1+m) behind STO device 22 and between the first TS and MP top surface 14t2 is also independently controlled to realize more degrees of freedom than a writer in the prior art.

Figure 17:
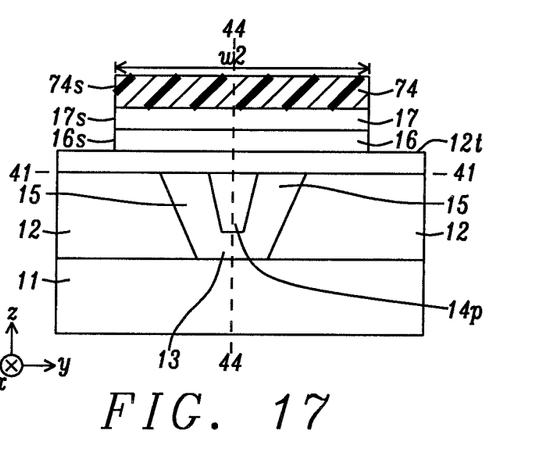
FIG. 17 is an ABS view of the writer structure in FIG. 15 after a second photoresist layer is patterned on the first TS layer, and the pattern is etch transferred through the first TS layer and write gap.

Referring to FIG. 17, a third photoresist layer is coated on the first TS layer 17, and is patternwise exposed and developed to yield a photoresist mask 74 with sides 74s and having a width w2 that corresponds to the desired width of the write gap 16 and first TS layer 17 at the ABS plane. Next, a RIE or IBE is performed to transfer the photoresist pattern through the first TS layer and write gap to generate sides 17s, 16s, respectively, that are coplanar with side 74s. The etch step stops on side shield top surface 12t at plane 41-41. As indicated previously, w2 is preferably greater than STO device width w, even in embodiments where w is greater than the maximum width w1 of the MP tapered trailing side.

Figure 18:
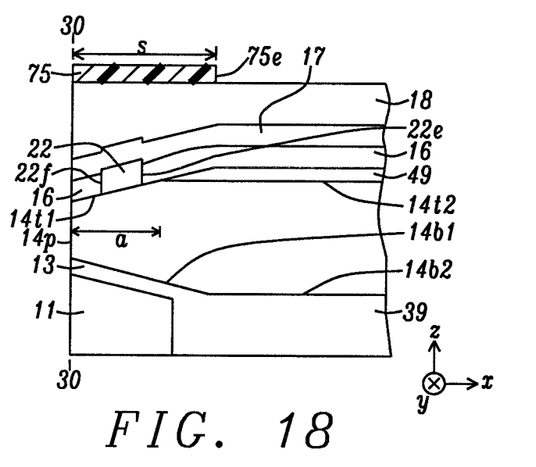
FIG. 18 is a down-track cross-sectional view of the writer structure in FIG. 17 after a second TS layer and third photoresist layer are sequentially formed on the first TS layer, and the third photoresist layer is patterned to generate a backside that will determine the backsides of the first and second TS layers.

FIG. 18 depicts the down-track cross-sectional view at plane 44-44 in FIG. 17 after photoresist mask 74 is removed, and the second TS layer 18 is deposited on first TS layer 17. A fourth photoresist layer is coated on the second TS layer and is patterned by a conventional photolithography method to yield photoresist mask 75 that extends from the ABS plane 30-30 to a backside 75e at height s from the ABS plane.

Figure 19:
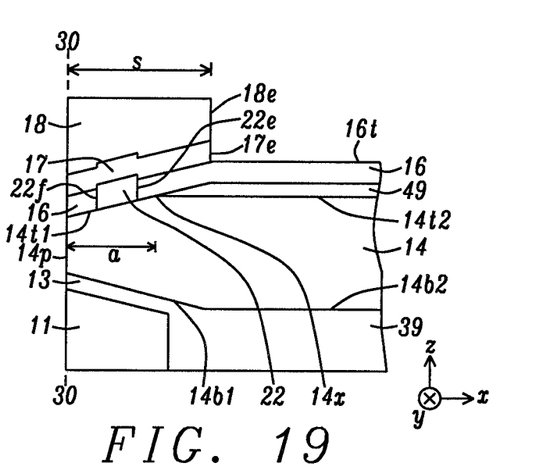
FIG. 19 is a down-track cross-sectional view of the writer structure in FIG. 18 after the photoresist pattern is etch transferred through the first and second TS layers, and the third photoresist layer is removed.

Referring to FIG. 19, a RIE or IBE process is performed to transfer the photoresist mask shape through the second TS layer 18, and through first TS layer 17 and stopping on write gap top surface 16t thereby generating second and first TS layer backsides 18e, 17e, respectively, at height s. Preferably, s>a. The photoresist mask is then removed with a well known method. The remainder of the writer structure is then formed on the second TS layer and write gap using conventional methods that are not described herein. One example of a completed read-write structure was described previously and is shown in FIG. 4. However, the present disclosure also encompasses other writer designs with different leading loop and trailing loop schemes for magnetic flux return as appreciated by those skilled in the art.

The recessed STO device described herein provides the benefit of reducing the write gap field 70g (FIG. 8B) between MP tip 14p and the trailing shield structure comprised of first TS layer 17, and in some embodiments enhances the write field 70 that is orthogonal to the ABS 30-30 and directed to one or more bits 99 in magnetic medium 140. As a result, reluctance is increased in write gap 16 between MP tapered trailing side 14t1 and first TS shield 17 thereby enhancing magnetic flux 70 from the MP tip 14p at the ABS. The process of forming the recessed STO device as described herein is readily implemented in existing writer fabrication schemes and enables more flexibility in writer design, especially with regard to dimension control of the STO device, first TS tip, and dielectric gap between the first TS layer and MP top surface as explained earlier.

While the present disclosure has been particularly shown and described with reference to, the preferred embodiment thereof, it will be understood by those skilled in the art that various changes in form and details may be made without departing from the spirit and scope of this disclosure.

We claim:

1. A process of forming a spin torque assisted magnetic recording writer, comprising:
   (a) providing a main pole (MP) comprised of a MP tip having a tapered trailing side bounded by two sides that each extend from an air bearing surface (ABS) plane to a MP corner at a first height (a) where the MP tapered trailing side connects to a top surface of a MP back portion and the MP corners are separated by a first cross-track width (w1), wherein the MP top surface is aligned orthogonal to the ABS plane, and the MP tapered trailing side is coplanar with a tapered front side of a dielectric layer on the MP top surface;
   (b) depositing a spin torque oscillator (STO) stack of layers with a thickness (t) on the MP tapered trailing side and on the dielectric layer, the STO stack of layers comprises:
      (1) a lower non-spin preserving layer;
      (2) a middle flux guiding layer (FGL) having a magnetization aligned parallel to a write gap field from the MP during a write process, and wherein the spin torque assisted magnetic recording writer is configured so that the FGL magnetization flips to an opposite direction when a current $I_b$ of sufficient magnitude is applied in a direction from a first trailing shield (TS) towards the MP tapered trailing side; and
      (3) an upper spin preserving layer;
   (c) forming a pattern in the STO stack of layers wherein a resulting STO shape having two sides separated with a constant second cross-track width (w), or separated with increasing or decreasing width with increasing distance from the ABS plane;
   (d) forming a STO front side at a second height (b), and a STO backside at a third height (h+b) from the STO front side, and wherein the STO front side and backside are connected by the two STO sides thereby defining a STO device having a height h;
   (e) depositing a write gap with a second thickness (d1) on the MP tapered trailing side between the ABS plane and the STO front side, and adjoining the STO backside, and adjoining the two STO sides;
   (f) depositing the first TS layer on the write gap and on the STO device, and forming two sides on the first TS layer and write gap that are separated by a third cross-track width (w2) at the ABS plane, wherein the two sides extend in a down-track direction to a top surface of a side shield on each side of the MP tip, and wherein w2>a maximum width of the STO device; and
   (g) depositing a second TS layer on the first TS layer and on the top surface of each side shield, and then simultaneously forming a backside on the first and second TS layers at a fourth height (s) from the ABS plane.

2. The method of claim 1 wherein a duration of the write gap deposition is adjusted so that d1<t, or d1≥t.

3. The method of claim 1 wherein the second height (b) is from 10 nm to 400 nm.

4. The method of claim 1 wherein the height (h) of the STO device is from 10 nm to 500 nm.

5. The method of claim 1 wherein the STO device has a trapezoidal shape, a substantially rectangular shape, or a shape with curved sizes from a top-down (down-track) view.

6. The method of claim 1 wherein w≤w1.

7. The method of claim 1 wherein the lower non-spin preserving layer is one of Ta, W, Pt, Ru, Rh, and Pd.

8. The method of claim 1 wherein the FGL is comprised of a multilayer of magnetic materials that is one or more of NiFe, CoFe, CoNi, and alloys thereof with one or more additional elements that are B, Mo, Pt, Pd, W, and Cr.

9. The method of claim 1 wherein the upper spin preserving layer is a conductive layer that is one of Cu, Ag, Au, Al, or Cr, or an alloy thereof.

10. The method of claim 1 wherein $I_b$ has a current density that is in a range of $1 \times 10^{-7}$ Amp/cm$^2$ to $1 \times 10^{-9}$ Amp/cm$^2$.

11. The method of claim 1 wherein (b+h)<a.

12. The method of claim 1 wherein a down-track thickness of a first TS tip feature that is above a top surface of the first TS is determined by the difference between t and d1.

13. The method of claim 1 wherein the two sides on the MP tip are separated with increasing cross-track width up to the first cross-track width w1 with increasing distance from the ABS plane.

14. The method of claim 1 wherein the constant second cross-track width w is at least 10 nm.

15. The method of claim 1 wherein forming a pattern in the STO stack of layers yields a STO shape that is rectangular such that the constant second cross-track width (w) is from the ABS plane to at least the first height.

16. The method of claim 1 wherein the spin torque assisted magnetic recording writer is part of a combined read-write head that is formed on a head gimbal assembly (HGA).

17. The method of claim 16 wherein the HGA is formed in a magnetic recording apparatus.

18. The method of claim 1 wherein the FGL has a magnetization saturation (Ms) value from 4 kiloGauss (kG) to 24 kG.

19. The method of claim 1 wherein s>a.

* * * * *